US006228764B1

United States Patent
Hwang

(10) Patent No.: US 6,228,764 B1
(45) Date of Patent: May 8, 2001

(54) METHOD OF FORMING WIRING IN SEMICONDUCTOR DEVICE

(75) Inventor: Soon Hong Hwang, Seoul (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/176,156

(22) Filed: Oct. 21, 1998

(30) Foreign Application Priority Data

Nov. 12, 1997 (KR) .................................. 97-59501
Sep. 2, 1998 (KR) .................................. 98-36141

(51) Int. Cl.[7] .............................................. H01L 21/4763
(52) U.S. Cl. ................................................ 438/643
(58) Field of Search ..................... 438/627, 643, 438/653, 927; 257/751, 752

(56) References Cited

U.S. PATENT DOCUMENTS 4,897,709 * 1/1990 Yokoyama et al. ..................... 357/67
5,572,072 * 11/1996 Lee ......................................... 257/751

* cited by examiner

*Primary Examiner*—David Nelms
*Assistant Examiner*—Dung A Le
(74) *Attorney, Agent, or Firm*—Morgan, Lewis & Bockius LLP

(57) ABSTRACT

A method of forming a wiring in a semiconductor device having a semiconductor substrate includes the steps of forming a barrier layer on the semiconductor substrate, forming a first metal layer on the barrier layer, forming a first alloy layer containing the first metal layer and a second metal layer on the first metal layer, and forming a second alloy layer by diffusing between the first metal layer and the first alloy layer.

20 Claims, 3 Drawing Sheets

METHOD OF FORMING WIRING IN SEMICONDUCTOR DEVICE

This application claims the benefit of Korean Applications No. 97-59501 filed Nov. 12, 1997, and No. 98-36141 filed Sep. 2, 1998, which are hereby incorporated by reference.

BACKGROUND OF THE INVENTION

1. Field of the Invention

The present invention relates to a semiconductor device, and more particularly, to a method of forming a wiring in a semiconductor device. Although the present invention is suitable for a wide scope of applications, it is particularly suitable for preventing an electromigration in the wiring of the semiconductor device.

2. Discussion of the Related Art

Aluminum (Al) has a desirable electrical conductivity and a good adherence to an insulating film and is easy to be formed in fabricating a semiconductor. Thus, aluminum (Al) and its alloy are one of the most preferred materials in fabricating a semiconductor device. In a physical vapor deposition (PVD) for depositing aluminum and its alloy, a concentration of copper (Cu) in a thin film to be formed is easily adjusted by altering the concentration of Cu in a target material.

A vertical wiring of contact/via layers having a high aspect ratio must be formed in fabricating a VLSI device. However, the contact/via layer is not completely filled by the PVD due to a poor step coverage. Accordingly, chemical vapor deposition (CVD) providing a good step coverage has been chosen to improve a problem of the PVD. During a CVD process, a surface chemical reaction is occurred to decompose a source gas and an intended material is deposited at the surface of a substrate.

Nevertheless, even the CVD has a drawback in depositing two different materials simultaneously although depositing a single material is relatively easy. Therefore, an addition of Cu in a later process is essential in depositing Al to reduce an electromigration. In the electromigration, aluminum atoms are diffused into the substrate at high current concentration regions. Especially, voids are formed at regions in contact with silicon or stepped regions, when a current passes through an aluminum wiring. Thus, as the wire becomes thinner, it is disconnected at the end. Accordingly, in the background art, a simultaneous deposition of aluminum and copper has been studied to employ the CVD process in forming a wiring in the semiconductor device.

However, the simultaneous deposition of aluminum and copper using CVD to form a wiring in a semiconductor device has the following problems.

It is very difficult to select different source gases for aluminum and copper which do not react with each other and have similar deposition temperatures. In addition, the amount of copper to be added into the source gases is difficult to be determined.

Further, when a pure copper is used to add the copper through a diffusion to chemically deposited aluminum, an intermetallic composition between aluminum and copper is formed, so that it increases an overall resistivity of the thin film and interferes an effective diffusion of the copper. As a result, an extra amount of the pure copper is needed to complete the diffusion process according to the background art.

SUMMARY OF THE INVENTION

Accordingly, the present invention is directed to a method of forming a wiring in a semiconductor device that substantially obviates one or more of the problems due to limitations and disadvantages of the related art.

An object of the present invention is to provide a method of forming a wiring in a semiconductor device which reduces a an electromigration in the wiring.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming a wiring in a semiconductor device includes the steps of forming a barrier layer on a semiconductor substrate, depositing a pure first metal film on the barrier layer, forming an alloy film of first, and second metals on the pure first metal film, and diffusing the second metal in the alloy film of first, and second metals into the first metal film.

In another aspect of the present invention, a method of forming a wiring in a semiconductor device having a semiconductor substrate includes the steps of forming a barrier layer on the semiconductor substrate, forming a first metal layer on the barrier layer, forming a first alloy layer containing the first metal layer and a second metal layer on the first metal layer, and forming a second alloy layer by diffusing between the first metal layer and the first alloy layer.

In another aspect of the present invention, a method of forming a wiring in a semiconductor device having a semiconductor substrate, comprising the steps of forming a barrier layer on the semiconductor substrate, forming a first metal layer on the barrier layer, forming a first alloy layer containing the first metal layer and a second metal layer on the first metal layer, forming a second metal layer, and forming a second alloy layer by diffusing between the first metal layer and the first alloy layer.

In a further aspect of the present invention, a method of forming a wiring in a semiconductor device having a semiconductor substrate, comprising the steps of forming a barrier layer on the semiconductor substrate, forming a first alloy layer containing first and second metal layers on the barrier layer, forming the first metal layer on the first alloy layer, and forming a second alloy layer by diffusing between the first metal layer and the first alloy layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

In general, aluminum and copper form intermetallic compositions when aluminum and copper present abundantly. Since these intermetallic compositions have a very high resistivity and a very low diffusivity in copper, a copper diffusion cannot be efficiently performed. In addition, since they have a very high melting point, copper can be added only when the intermetallic compositions are heat-treated at a very high temperature. Therefore, in the method of forming a wiring in a semiconductor device of the present invention, an aluminum-copper alloy source having a composition which will not form intermetallic compositions and which can form $Al_3Cu$ for reducing an electromigration is used for an effective addition of copper in forming the wiring.

An alloy source for an aluminum-copper composition of Al-33 wt %Cu is formed to have a melting point of 548.2° C., which is lower than that of the intermetallic composition. Thus, copper can be effectively diffused with a heat treatment under a low temperature and the intermetallic composition at an interface between aluminum and the alloy source of aluminum-copper is not formed, thereby reducing an electromigration by adding a necessary amount of copper.

Reference will now be made in detail to the preferred embodiments of the present invention, examples of which are illustrated in the accompanying drawings.

Figure 1A:
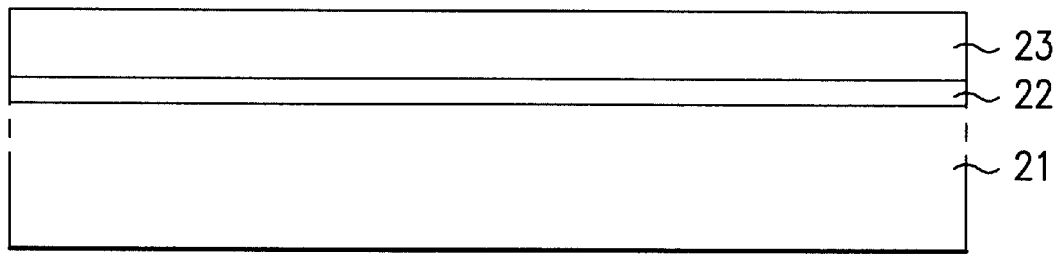
FIGS. 1A to 1C are cross-sectional views illustrating the process steps of forming a wiring in a semiconductor device in accordance with a first embodiment of the present invention.
Figure 1B:
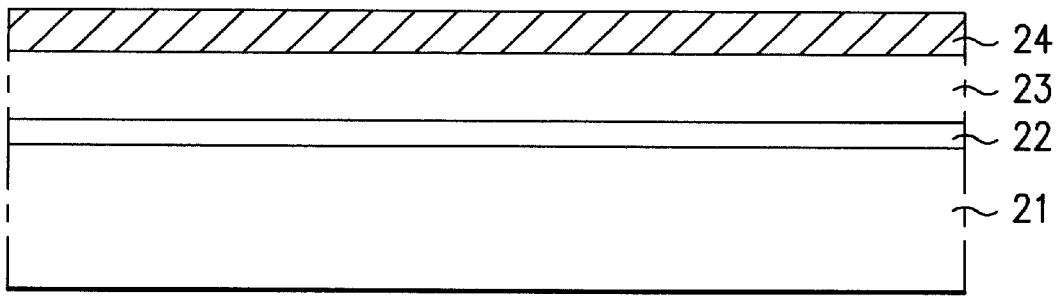
Figure 1C:
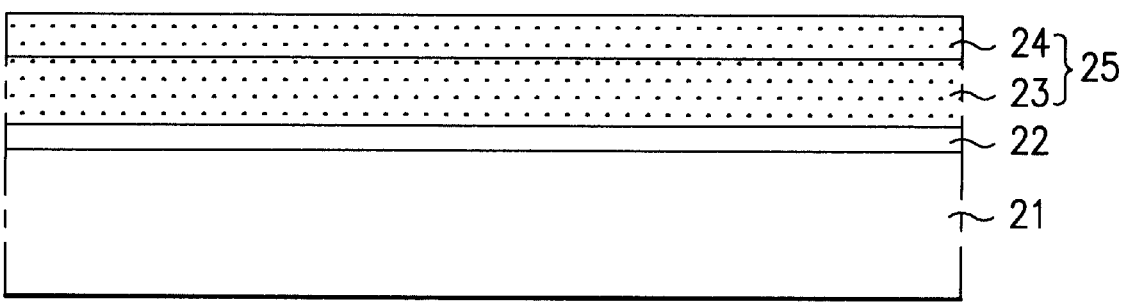

FIGS. 1A to 1C are cross-sectional views illustrating the process steps of forming a wiring in a semiconductor device in accordance with a first embodiment of the present invention.

Initially referring to FIG. 1A, a barrier layer 22, such as a Ti or TiN layer, is formed on a semiconductor substrate 21, and a pure aluminum layer 23 is deposited on the barrier layer 22 to have a thickness of 5000 Å by thermal chemical vapor deposition (CVD) or plasma enhanced chemical vapor deposition (PECVD) through a decomposition of the source gases.

As shown in FIG. 1B, an aluminum-copper alloy layer 24 is formed on the aluminum layer 23 by sputtering. A composition of the aluminum-copper alloy layer 24 is Al 5 to 52 wt % and Cu 48 to 95 wt %.

In FIG. 1C, the aluminum-copper alloy layer 24 on the semiconductor substrate 21 is subjected to annealing in order to diffuse copper contained in the aluminum-copper alloy layer 24 into the aluminum layer 23, thereby forming a thin film 25.

Figure 2:
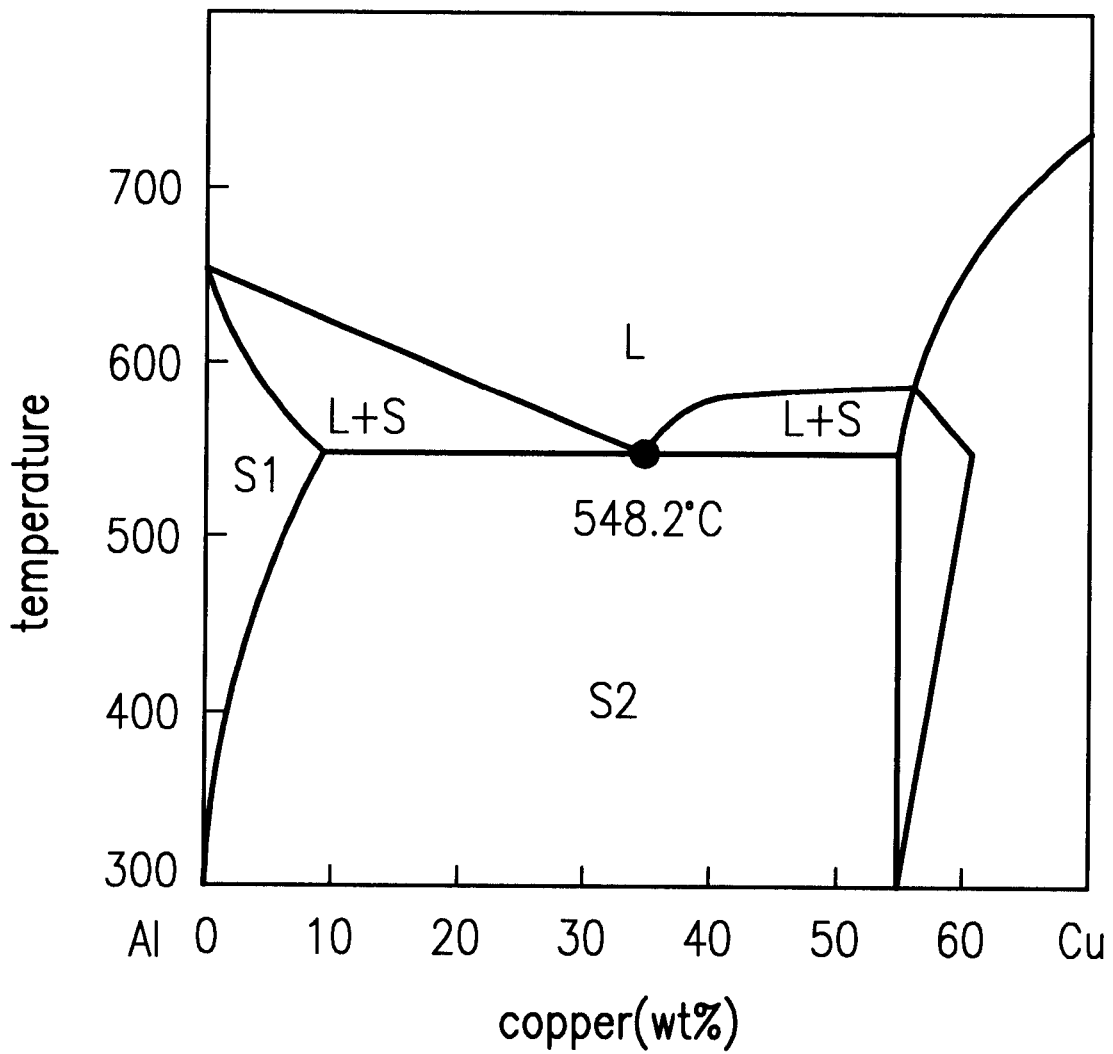
FIG. 2 is aluminum-copper phase diagram.

FIG. 2 is an aluminum-copper phase diagram, where x-axis represents a weight percent of copper contained in aluminum and y-axis represents a temperature. L denotes a liquid phase, L+S (Liquid+Solid) denotes a mixed state of liquid and solid, S1 (Solid) denotes a solid state, and S2 denotes a solid solution state.

In the present invention, an annealing temperature for diffusion of copper in the aluminum-copper alloy 24 into the aluminum layer 23 is approximately 400~500° C. Since a liquid state held constant at a temperature of 548.2° C. in a range of composition as shown in the Al—Cu phase diagram of FIG. 2 (containing 5~52 wt % of copper in aluminum), annealing should be conducted at a temperature below 548.2° C. Since copper can diffuse at a temperature over 400° C., the annealing may be conducted at a temperature range of 400~548.2° C. However, an annealing process at a temperature in the vicinity of 548.2° C. may be too high for the aluminum layer because the temperature is close to the melting temperature of aluminum. Thus, a wiring may be damaged by annealing at this temperature range. An appropriate annealing temperature is 400~500° C. with a duration of annealing of ½~2 hrs, and preferably 1 hr.

When aluminum contains 5~52 wt % of copper, copper is existed in $Al_2Cu$ state, which starts to decompose at around 400° C. Also, copper can be diffused into aluminum at around this temperature. In a diffusion process, copper diffuses into the pure aluminum layer 23 until an equilibrium of a copper concentration is reached between the pure aluminum film 23 and the aluminum-copper alloy layer 24. When the pure aluminum layer 23 is deposited to have a thickness of about 5000 Å, a composition and a thickness of the aluminum-copper alloy to contain copper in aluminum to be at 0.5 wt % is shown in TABLE 1 as follows.

TABLE 1

| Al—Cu composition vs. thickness of Al—Cu alloy layer | | |
|---|---|---|
| thickness of pure Al layer | Al—Cu composition | thickness of Al—Cu alloy layer |
| 5000Å | Al—5 wt % Cu | 575 ± 50Å |
| 5000Å | Al—10 wt % Cu | 270 ± 30Å |
| 5000Å | Al—15 wt % Cu | 170 ± 20Å |
| 5000Å | Al—20 wt % Cu | 120 ± 10Å |
| 5000Å | Al—25 wt % Cu | 90 ± 10Å |
| 5000Å | Al—30 wt % Cu | 70 ± Å |
| 5000Å | Al—35 wt % Cu | 55 ± Å |
| 5000Å | Al—40 wt % Cu | 45 ± Å |
| 5000Å | Al—45 wt % Cu | 40 ± Å |
| 5000Å | Al—50 wt % Cu | 30 ± Å |
| 5000Å | Al—55 wt % Cu | 25 ± Å |

The above compositions show a result when an overall composition is adjusted to contain 0.5 wt % copper in aluminum after processes of chemical vapor deposition and diffusion. In this process, when the Al—Cu alloy layer is too thin (specially less than 100 Å), a thin film forming process is difficult because a sputtering time in a PVD process should be very short. Alternatively, when a composition other than the 0.5 wt % copper is selected, a thickness may be adjusted in accordance with each composition.

Figure 3:
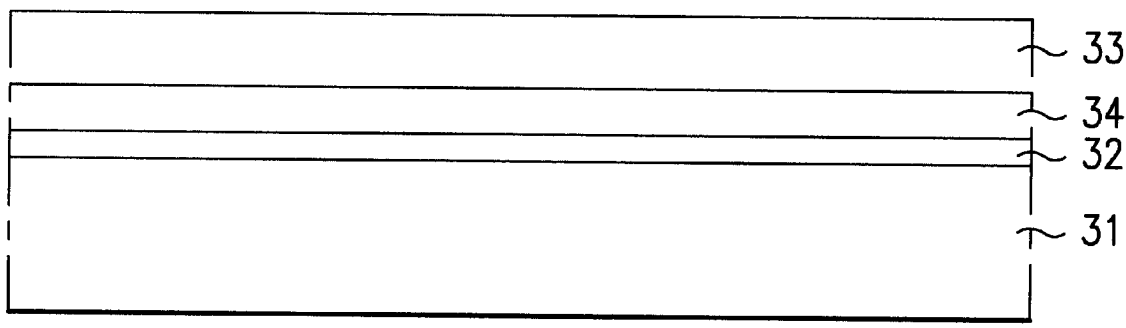
FIG. 3 is a cross-sectional view illustrating the process step of forming a wiring in a semiconductor device in accordance with a second embodiment of the present invention.

FIG. 3 illustrates a cross-sectional view showing the process step of forming a wiring in a semiconductor device in accordance with a second embodiment of the present invention. In the second embodiment, an aluminum-copper alloy layer 34 is formed on a barrier layer 32 (Ti or TiN) after the barrier layer 32 is formed on a semiconductor substrate 31. Thereafter, a pure aluminum layer 33 is formed on the aluminum-copper alloy layer 34, and a heat-treatment is then conducted as described above in the first embodiment.

Figure 4:
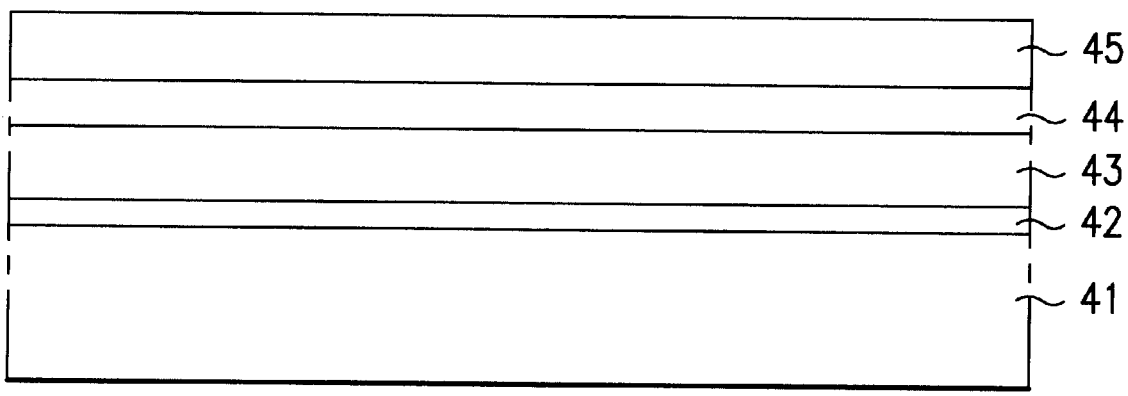
FIG. 4 is a cross-sectional view illustrating the process step of forming a wiring in a semiconductor device in accordance with a third embodiment of the present invention.

FIG. 4 is a cross-sectional view showing the process of forming a wiring in a semiconductor device in accordance with a third embodiment of the present invention. A first pure aluminum layer 43 having a thickness of 2500 Å is formed on a barrier layer 42 (Ti or TiN) over a semiconductor substrate 41. After a second pure aluminum layer 45 is formed on the aluminum-copper alloy layer 44, a heat-treatment is conducted to initiate a diffusion process as set forth above.

The aforementioned method of forming a wiring in a semiconductor device of the present invention has the following advantages.

A process of forming a wiring in the semiconductor device is much easier than that of simultaneous deposition of aluminum and copper using CVD in the background art because an amount of copper to be added is readily controlled in the present invention.

Further, an electromigration in a wiring is reduced by using an aluminum-copper alloy rather than a pure copper.

It will be apparent to those skilled in the art that various modifications and variations can be made in the method of forming a wiring in a semiconductor device of the present invention without departing from the spirit or scope of the invention. Thus, it is intended that the present invention cover the modifications and variations of this invention provided they come within the scope of the appended claims and their equivalents.

What is claimed is:

1. A method of forming a wiring in a semiconductor device having a semiconductor substrate, comprising the steps of:

forming a barrier layer on the semiconductor substrate;

forming a first metal layer on the barrier layer;

forming a first alloy layer containing first and second metal compositions on the first metal layer; and forming a second alloy layer by diffusing between the first metal layer and the first alloy layer.

2. The method according to claim 1, wherein the first metal layer and the first metal composition include aluminum.

3. The method according to claim 1, wherein the second metal composition includes copper.

4. The method according to claim 1, wherein the first alloy layer is composed of 5 to 52 wt % of the first metal composition and 48 to 95 wt % of the second metal composition, respectively.

5. The method according to claim 1, wherein the barrier layer includes one of titanium or titanium nitride.

6. The method according to claim 1, wherein the first metal layer is formed to have a thickness of 5000 Å using chemical vapor deposition.

7. The method according to claim 1, wherein the first alloy layer is formed to have a thickness of at least 100 Å using physical vapor deposition.

8. The method according to claim 1, wherein the step of forming a second alloy layer has a 0.5 wt % of the second metal composition.

9. The method according to claim 1, wherein the step of forming a second alloy layer includes a heat-treatment.

10. The method according to claim 9, wherein the heat-treatment is conducted at a temperature of 400~500° C.

11. The method according to claim 9, wherein the heat-treatment is conducted for ½ to 2 hrs.

12. A method of forming a wiring in a semiconductor device having a semiconductor substrate, comprising the steps of:

forming a barrier layer on the semiconductor substrate:

forming a first metal layer on the barrier layer;

forming a first alloy layer containing first and second metal compositions on the first metal layer;

forming a second metal layer on the first alloy layer; and forming a second alloy layer by diffusing among the first and second metal layers and the first alloy layer.

13. The method according to claim 12, wherein the first and second metal layers and the first metal composition include aluminum.

14. The method according to claim 12, wherein the second metal composition includes copper.

15. The method according to claim 12, wherein the first alloy layer is composed of 5 to 52 wt % of the first metal composition and 48 to 95 wt % of the second metal composition, respectively.

16. The method according to claim 12, wherein the first metal layer is formed to have a thickness of 5000 Å using chemical vapor deposition.

17. The method according to claim 12, wherein the first alloy layer is formed to have a thickness of at least 100 Å using physical vapor deposition.

18. A method of forming a wiring in a semiconductor device having a semiconductor substrate, comprising the steps of:

forming a barrier layer on the semiconductor substrate:

forming a first alloy layer containing first and second metal compositions on the barrier layer;

forming the first metal layer on the first alloy layer; and forming a second alloy layer by diffusing between the first metal layer and the first alloy layer.

19. The method according to claim 18, wherein the first metal layer and the first metal composition include aluminum.

20. The method according to claim 18, wherein the second metal composition includes copper.

* * * * *